US009095049B2

(12) United States Patent
Dai et al.

(10) Patent No.: US 9,095,049 B2
(45) Date of Patent: Jul. 28, 2015

(54) METHOD FOR MAKING AN ELECTROMAGNETIC SHIELDING LAYER

(71) Applicants: Tsinghua University, Beijing (CN); HON HAI PRECISION INDUSTRY CO., LTD., New Taipei (TW)

(72) Inventors: Feng-Yuen Dai, New Taipei (TW); Chi-Chuang Ho, New Taipei (TW); Ji-Hong Pan, Beijing (TW); Yong Zheng, Beijing (CN); Kai-Li Jiang, Beijing (CN); Liang Liu, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 131 days.

(21) Appl. No.: 14/021,247

(22) Filed: Sep. 9, 2013

(65) Prior Publication Data
US 2014/0008013 A1 Jan. 9, 2014

Related U.S. Application Data

(63) Continuation of application No. 12/284,919, filed on Sep. 25, 2008, now Pat. No. 8,563,875.

(30) Foreign Application Priority Data
Dec. 21, 2007 (CN) .......................... 2007 1 01254058

(51) Int. Cl.
B29C 65/48 (2006.01)
B32B 37/00 (2006.01)
B32B 43/00 (2006.01)
H05K 9/00 (2006.01)

(52) U.S. Cl.
CPC .............. *H05K 9/009* (2013.01); *H05K 9/0088* (2013.01)

(58) Field of Classification Search
CPC ...... H05K 9/0088; H05K 9/009; B29C 39/10; C09J 5/00; B32B 38/18; B32B 38/1808; B32B 43/00
USPC ........ 156/247, 278, 280; 428/293.7; 174/350, 174/377, 390; 361/816, 818; 977/742, 789
See application file for complete search history.

(56) References Cited

U.S. PATENT DOCUMENTS

| | | | | |
|---|---|---|---|---|
| 6,818,821 | B2 * | 11/2004 | Fujieda et al. | 174/394 |
| 7,239,261 | B2 * | 7/2007 | Fujieda et al. | 342/1 |
| 7,301,109 | B2 * | 11/2007 | Chen | 174/350 |
| 7,645,497 | B2 * | 1/2010 | Spath et al. | 428/1.4 |
| 7,928,327 | B2 * | 4/2011 | Tuen et al. | 174/386 |
| 7,935,415 | B1 * | 5/2011 | Hansen et al. | 428/292.1 |
| 8,351,220 | B2 * | 1/2013 | Liang et al. | 361/818 |
| 8,466,365 | B2 * | 6/2013 | Gundel | 174/110 R |
| 8,492,655 | B2 * | 7/2013 | Gundel | 174/117 F |
| 8,520,406 | B2 * | 8/2013 | Liang et al. | 361/818 |
| 8,580,128 | B2 * | 11/2013 | Watanabe et al. | 216/41 |
| 8,933,333 | B2 * | 1/2015 | Gundel | 174/110 R |
| 2003/0155143 | A1 * | 8/2003 | Fujieda et al. | 174/35 MS |
| 2004/0047038 | A1 * | 3/2004 | Jiang et al. | 359/486 |

(Continued)

*Primary Examiner* — Sing P Chan
(74) *Attorney, Agent, or Firm* — Novak Druce Connolly Bove + Quigg LLP

(57) ABSTRACT

A method for making the electromagnetic shielding layer is provided. An electronic element has a surface is provided. At least one carbon nanotube film is fabricated. A carbon nanotube film structure is formed on the surface of the electronic element. A conductive layer is formed on the carbon nanotube film structure to obtain the electromagnetic shielding layer on the surface of the electronic element.

18 Claims, 9 Drawing Sheets

(56) References Cited

U.S. PATENT DOCUMENTS

| | | | |
|---|---|---|---|
| 2004/0146452 A1* | 7/2004 | Fujieda et al. | 423/447.2 |
| 2004/0230271 A1* | 11/2004 | Wang et al. | 607/116 |
| 2004/0249428 A1* | 12/2004 | Wang et al. | 607/116 |
| 2005/0029498 A1* | 2/2005 | Elkovitch et al. | 252/500 |
| 2005/0035896 A1* | 2/2005 | Fujieda et al. | 342/1 |
| 2005/0113873 A1* | 5/2005 | Weiner et al. | 607/2 |
| 2006/0011054 A1* | 1/2006 | Walthall et al. | 86/50 |
| 2006/0025515 A1* | 2/2006 | Scaringe et al. | 524/496 |
| 2006/0274049 A1* | 12/2006 | Spath et al. | 345/173 |
| 2007/0116916 A1* | 5/2007 | Ito et al. | 428/46 |
| 2007/0190316 A1* | 8/2007 | Kazakevics | 428/336 |
| 2008/0057265 A1* | 3/2008 | Liang et al. | 428/114 |
| 2008/0262581 A1* | 10/2008 | Barsness et al. | 607/115 |
| 2009/0029127 A1* | 1/2009 | Watanabe et al. | 428/209 |
| 2009/0092813 A1* | 4/2009 | Lin et al. | 428/220 |
| 2009/0114437 A1* | 5/2009 | Tuen et al. | 174/350 |
| 2009/0135042 A1* | 5/2009 | Umishita et al. | 342/1 |
| 2009/0169870 A1* | 7/2009 | Zheng | 428/332 |
| 2009/0287426 A1* | 11/2009 | Kukowski | 702/35 |
| 2010/0009094 A1* | 1/2010 | Lochtman et al. | 427/555 |
| 2010/0053035 A1* | 3/2010 | Lee et al. | 345/60 |
| 2010/0059243 A1* | 3/2010 | Chang | 174/36 |
| 2010/0096181 A1* | 4/2010 | Nakamura et al. | 174/394 |
| 2010/0188833 A1* | 7/2010 | Liang et al. | 361/818 |
| 2010/0300744 A1* | 12/2010 | Romanko et al. | 174/388 |
| 2010/0315105 A1* | 12/2010 | Fornes | 324/693 |
| 2011/0049437 A1* | 3/2011 | Crain et al. | 252/511 |
| 2011/0135491 A1* | 6/2011 | Shah et al. | 416/241 R |
| 2011/0174960 A1* | 7/2011 | Weaver et al. | 250/214 SW |
| 2011/0268950 A1* | 11/2011 | Miyazawa et al. | 428/220 |
| 2012/0000691 A1* | 1/2012 | Shah et al. | 174/102 R |
| 2012/0237721 A1* | 9/2012 | Lin et al. | 428/114 |
| 2012/0267159 A1* | 10/2012 | Gundel | 174/350 |
| 2012/0277360 A1* | 11/2012 | Scheffer et al. | 524/237 |
| 2012/0298395 A1* | 11/2012 | Gundel | 174/105 R |
| 2013/0077095 A1* | 3/2013 | Besko | 356/320 |
| 2013/0079609 A1* | 3/2013 | Besko | 600/324 |
| 2013/0118796 A1* | 5/2013 | Liang et al. | 174/394 |
| 2013/0196175 A1* | 8/2013 | Levit et al. | 428/688 |
| 2013/0202865 A1* | 8/2013 | Choi et al. | 428/216 |
| 2013/0240261 A1* | 9/2013 | Song et al. | 174/391 |
| 2013/0264089 A1* | 10/2013 | Gundel | 174/105 R |
| 2013/0277088 A1* | 10/2013 | Gundel | 174/107 |
| 2013/0333915 A1* | 12/2013 | Gundel | 174/102 R |
| 2013/0341063 A1* | 12/2013 | Gundel | 174/103 |
| 2013/0341081 A1* | 12/2013 | Liang et al. | 174/394 |
| 2013/0344237 A1* | 12/2013 | Guo | 427/127 |
| 2014/0000930 A1* | 1/2014 | Gundel | 174/105 R |
| 2014/0097016 A1* | 4/2014 | Miyake | 174/377 |
| 2014/0151111 A1* | 6/2014 | Shah et al. | 174/388 |
| 2015/0027771 A1* | 1/2015 | Kagawa | 174/350 |

* cited by examiner ial and received a great deal of interest since the early 1990s.
METHOD FOR MAKING AN ELECTROMAGNETIC SHIELDING LAYER

CROSS-REFERENCE TO RELATED APPLICATIONS

This application is a continuation of U.S. patent application Ser. No. 12/284,919 filed on Sep. 25, 2008 entitled, "ELECTROMAGNETIC SHIELDING LAYER AND METHOD FOR MAKING THE SAME". The disclosures of the above-identified applications are incorporated herein by reference.

BACKGROUND

1. Technical Field

The present invention relates to an electromagnetic shielding layer and method for making the same and, particularly, to a carbon nanotube based electromagnetic shielding layer and method for making the same.

2. Discussion of the Related Art

Carbon nanotubes (CNTs) are a novel carbonaceous material and received a great deal of interest since the early 1990s. CNTs are electrically conductive, chemically stable, and individually capable of having a very small diameter (much less than 100 nanometers) and a large aspect ratio (length/diameter). Due to these properties, along with others, it has been suggested that CNTs can play an important role in various fields, such as microscopic electronics, field emission devices, thermal interface materials, etc.

With recent developments in the electronics industry, various compact devices are increasingly prone to electromagnetic interference. To improve the security and performance of these devices, many electronic accessories in the compact device, along with its shell, should maintain a good connection with the ground. The shell of the device is usually made of plastic and contains a conductive coating, which is usually formed on the surface of the plastic material to shield the device from electromagnetic interference. The electromagnetic shielding layer is produced either by spraying or painting the conductive coating to the surface of the plastic material. The conductive material can be polymer, metal powder, graphite, and metal oxide, among others. However, the conductive coating is typically too thin to effectively shield the device from electromagnetic interference. The conductive coating must be thicker to properly shield the device from unwanted interference. One drawback, however, is that the cost of the conductive coating used to produce the electromagnetic shielding layer is high. Furthermore, if the conductive coating is too thick, the electrical conductivity thereof won't be as steady.

What is needed, therefore, is to provide an electromagnetic shielding layer with good electrical conductivity and a method for making the same.

BRIEF DESCRIPTION OF THE DRAWINGS

Many aspects of the present electromagnetic shielding layer and method for making the same can be better understood with reference to the following drawings.

The components in the drawings are not necessarily drawn to scale, the emphasis instead being placed upon clearly illustrating the principles of the present electromagnetic shielding layer and method for making the same.

Figure 1:
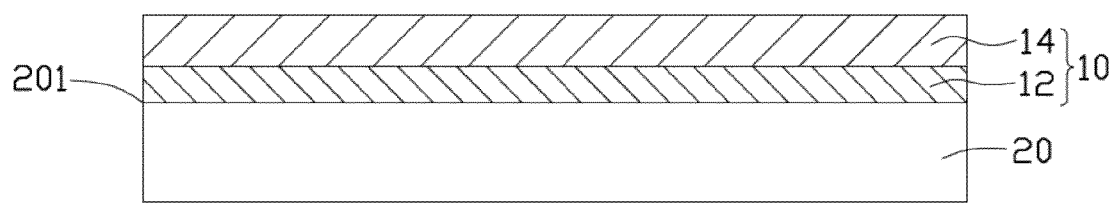
FIG. 1 is a schematic view of an electromagnetic shielding layer, in accordance with an exemplary embodiment.

Corresponding reference characters indicate corresponding parts throughout the several views. The exemplifications set out herein illustrate at least one embodiment of the electromagnetic shielding layer and method for making the same, in at least one form, and such exemplifications are not to be construed as limiting the scope of the invention in any manner.

DETAILED DESCRIPTION

References will now be made to the drawings to describe, in detail, embodiments of the electromagnetic shielding layer and method for making the same.

Referring to FIG. 1, an electromagnetic shielding layer 10, according to an exemplary embodiment, includes a first conductive layer 14 and a carbon nanotube film structure 12. The first conductive layer 14 is disposed on the carbon nanotube film structure 12, and comes in contact with the carbon nanotube film structure 12 electrically. An electronic element 20 has a surface 201, the electromagnetic shielding layer 10 is located on the electronic element 20 with the carbon nanotube film structure 12 attached to the surface 201. The electromagnetic shielding layer 10 is used to shield the electronic element 20 from electromagnetic waves.

Figure 2:
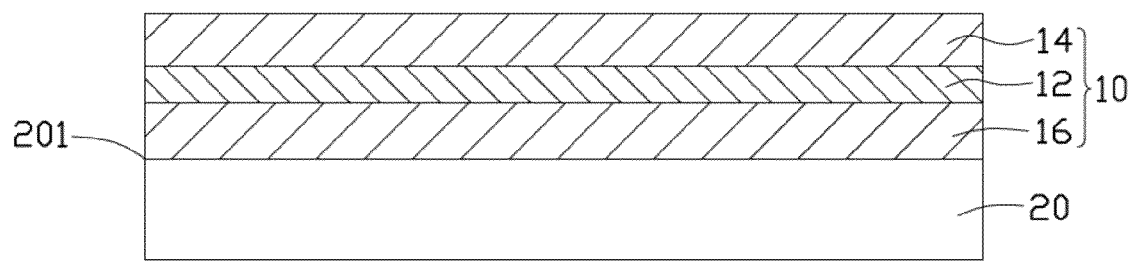
FIG. 2 is a schematic view of an electromagnetic shielding layer, in accordance with another exemplary embodiment.

Referring to FIG. 2, the electromagnetic shielding layer 10 can further include a second conductive layer 16. The second conductive layer 16 is arranged between the carbon nanotube film structure 12 and the electronic element 20, and electrically comes in contact with the carbon nanotube film structure 12 and the electronic element 20, respectively. The electromagnetic shielding layer 10 is coated on the electronic element 20 with the second conductive layer 16 attached to the surface 201. The thickness of the electromagnetic shielding layer 10 approximately ranges from 20 to 30 microns. In this embodiment, the thickness of the electromagnetic shielding layer 10 is 25 microns.

The thickness of the first conductive layer 14 and the second conductive layer 16 approximately ranges from 10 to 15 microns. The first conductive layer 14 and the second conductive layer 16 are made of metal or conductive polymer. In the embodiment, the first conductive layer 14 and the second conductive layer 16 are made of nickel.

Figure 3:
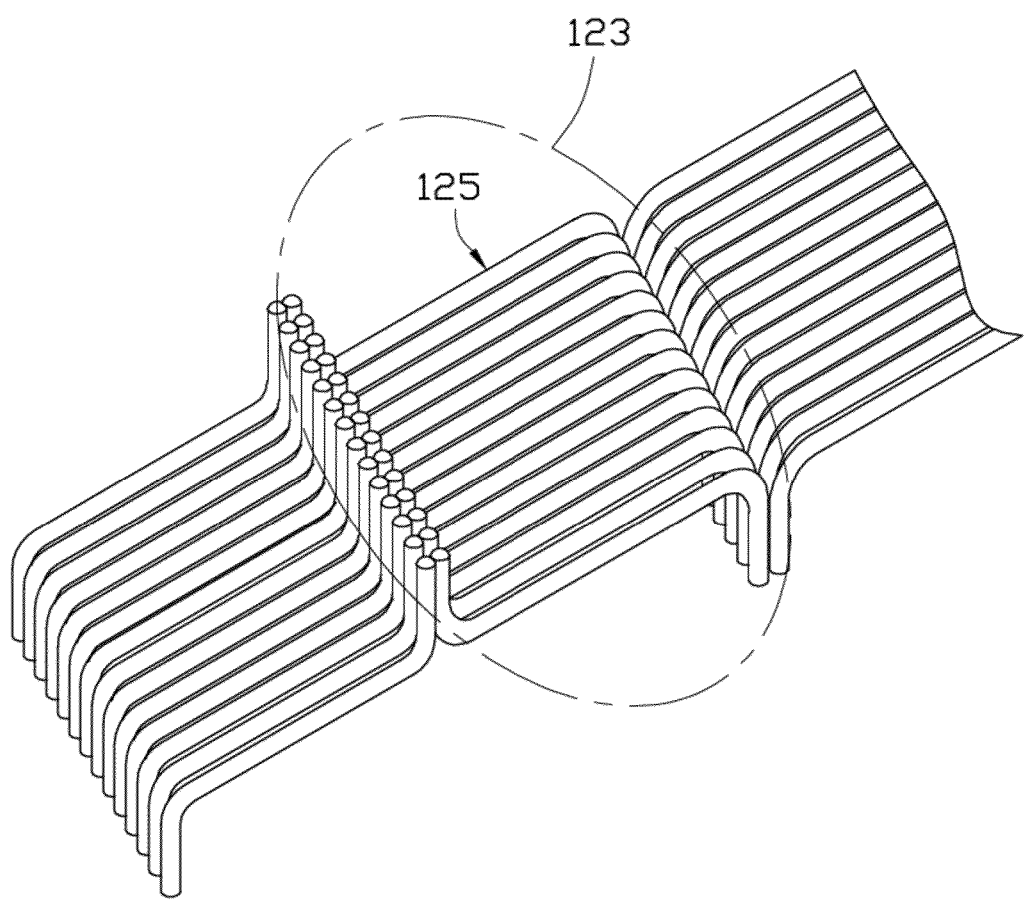
FIG. 3 is a structural schematic of a carbon nanotube film including a plurality of successively oriented carbon nanotube segments joined end-to-end by van der Waals attractive force.
Figure 4:
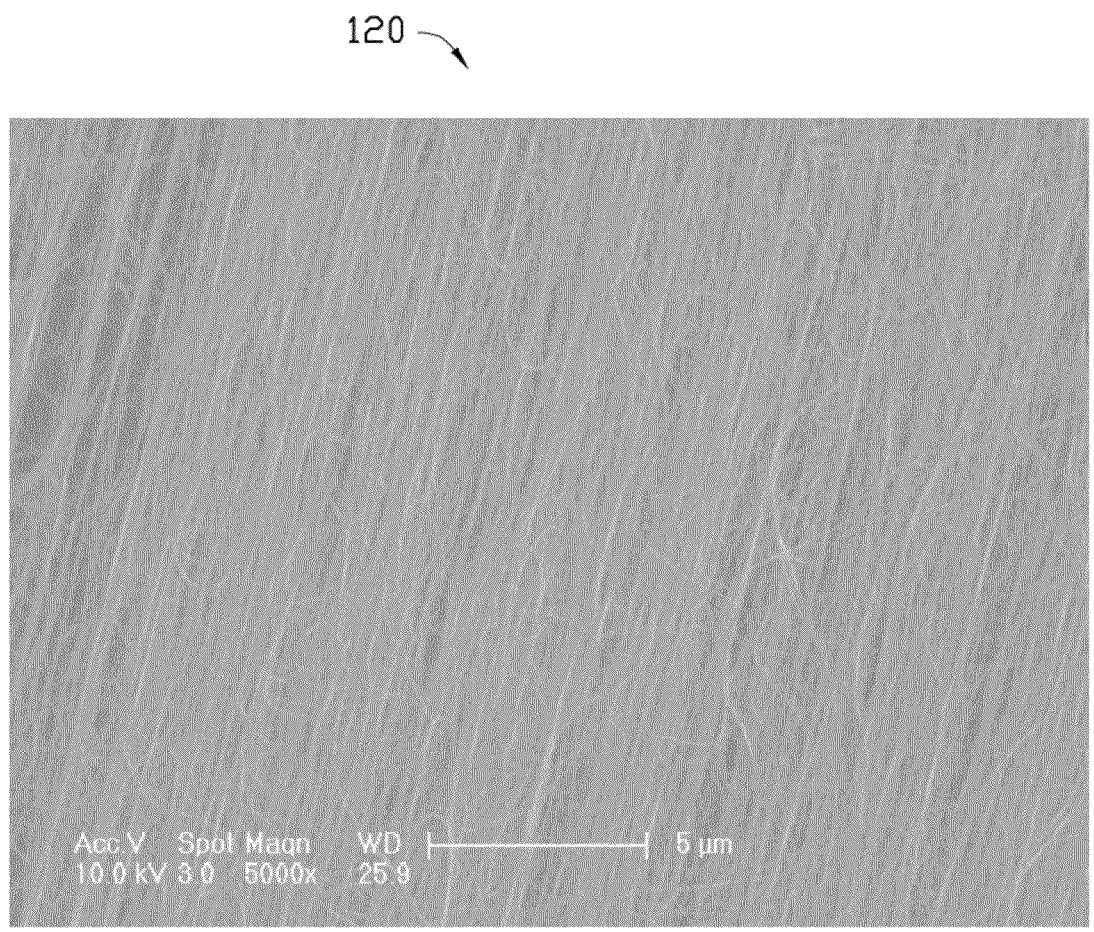
FIG. 4 shows a Scanning Electron Microscope (SEM) image of a carbon nanotube film of an electromagnetic shielding layer, in accordance with an exemplary embodiment.

Referring to FIG. 3 and FIG. 4, the carbon nanotube film structure 12 includes one carbon nanotube film 120. Each carbon nanotube film 120 includes a plurality of carbon nanotubes 125 primarily oriented a single direction. Specifically, each given carbon nanotube film 120 includes a plurality of successively oriented carbon nanotube segments 123 joined end-to-end by van der Waals attractive force. Furthermore, each carbon nanotube segment 123 has a plurality of the carbon nanotubes 125. The carbon nanotubes 125 have substantially the same length and are parallel to each other. Adjacent carbon nanotubes 125 are secured together by van der Waals attractive force.

Figure 4A:
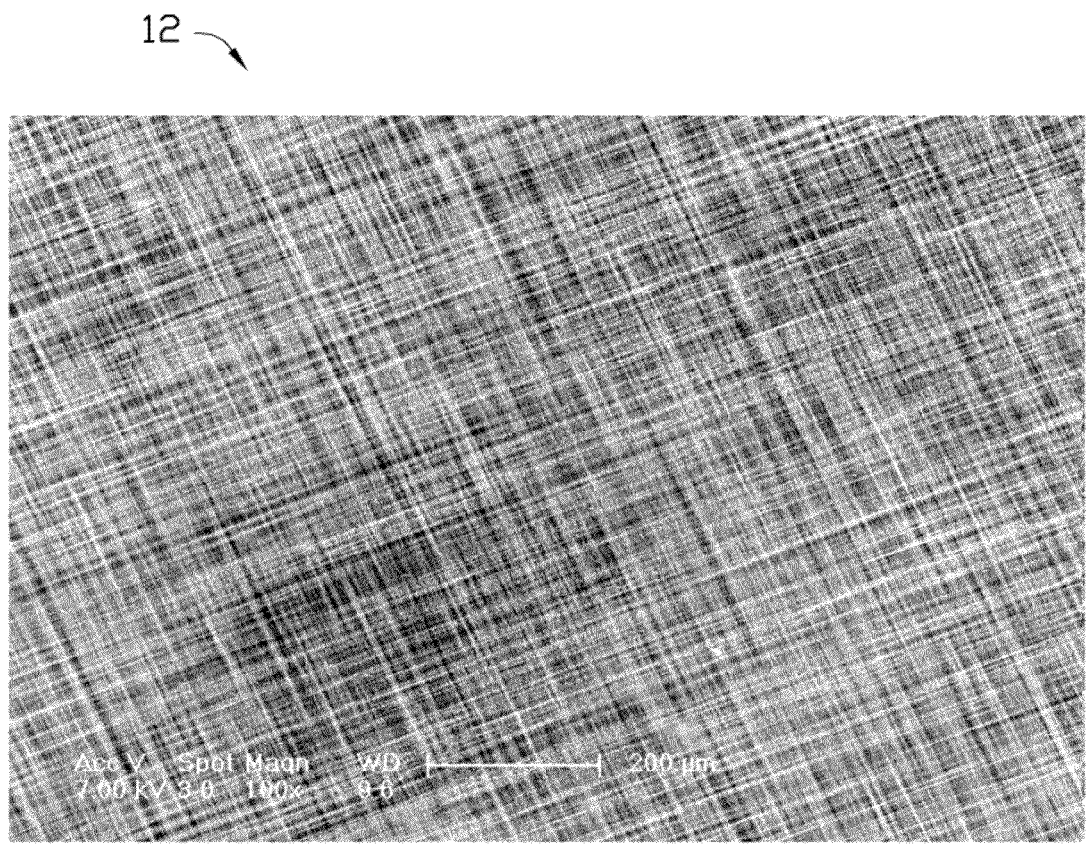
FIG. 4A shows an SEM image of one embodiment of a carbon nanotube film structure including include at least two stacked carbon nanotube films.
Figure 4B:
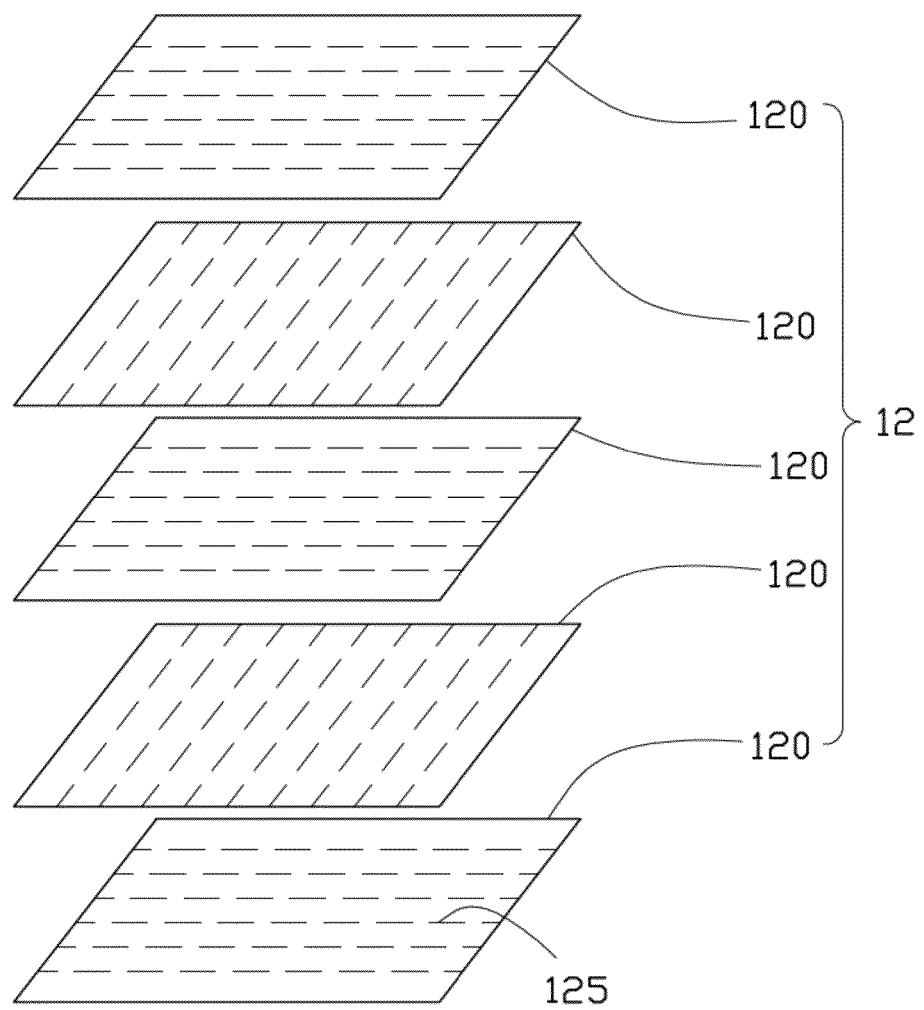
FIG. 4B is an exploded, isometric view of the carbon nanotube film structure of FIG. 4A.
Figure 4C:
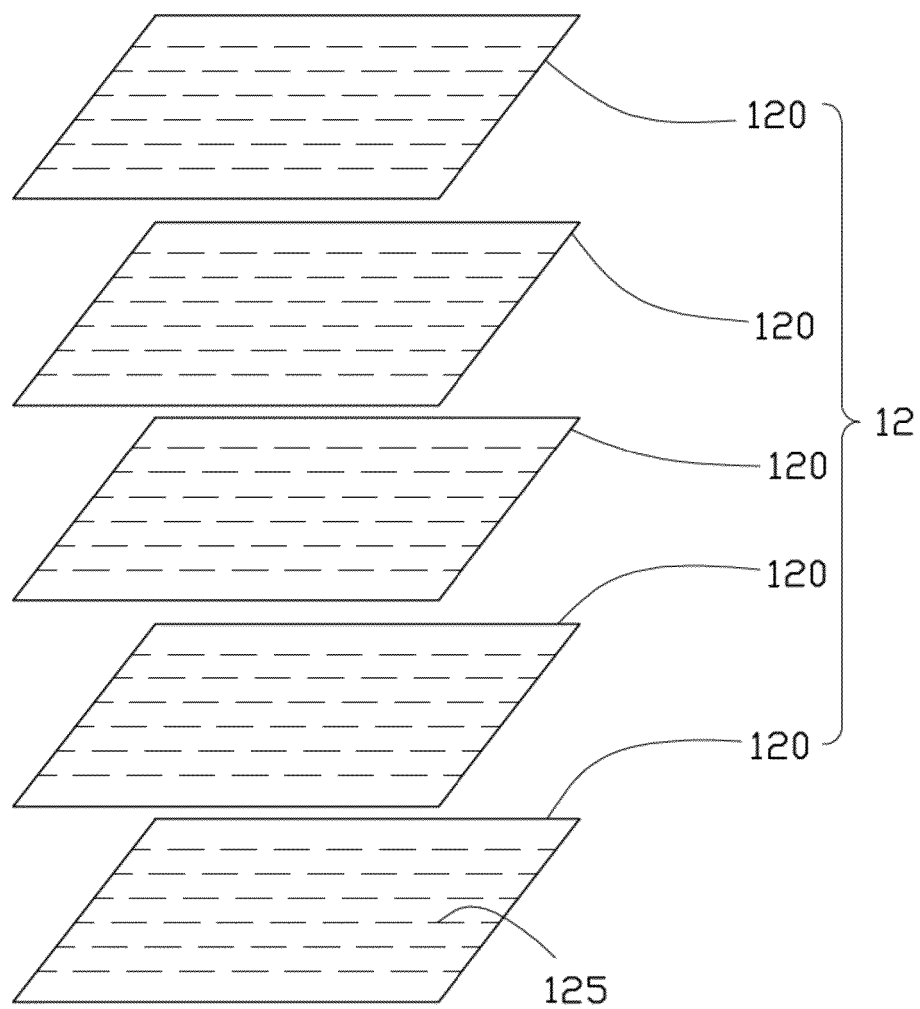
FIG. 4C is an exploded, isometric view of another embodiment a carbon nanotube film structure.

Referring from FIG. 4A to FIG. 4C, the carbon nanotube film structure 12 can also include at least two stacked carbon nanotube films 120. Each carbon nanotube film 120 includes a plurality of carbon nanotube segments 123 primarily oriented a single direction and the each segment has a plurality of carbon nanotubes 125 primarily oriented along the same direction. An angle between the primary orientation of the carbon nanotubes 125 of any two adjacent carbon nanotube films, ranges from greater than or equal to 0° to less than or equal to 90°. Referring to FIGS. 4A and 4B, the carbon nanotubes 125 in each film are primarily oriented along a single direction. An angle between primary orientation of the carbon nanotubes 125 of any two adjacent carbon nanotube films 120 is 90°.

Referring to FIG. 4C, in this embodiment, the carbon nanotube film structure 12 includes five carbon nanotube films 120. The carbon nanotubes 125 in each film are primarily oriented along a single direction. An angle between primary orientation of the carbon nanotubes 125 of any two adjacent carbon nanotube films is 0°. The thickness of the carbon nanotube film is 100 nanometers.

The carbon nanotubes 125 of the carbon nanotube film 120 can be single-wall carbon nanotubes, double-wall carbon nanotubes, multi-wall carbon nanotubes, or combinations thereof. A diameter of the carbon nanotubes 125 approximately ranges from 0.5 to 50 nanometers.

The carbon nanotube film structure 12 can be directly adhered to the surface 201 of the electronic element 20 due to its high purity and a large surface area of the carbon nanotubes. The first conductive layer 14 is disposed on the carbon nanotube film structure 12 and firmly attaches the carbon nanotube film structure 12 on the surface 201 of the electronic element 20.

Figure 5:
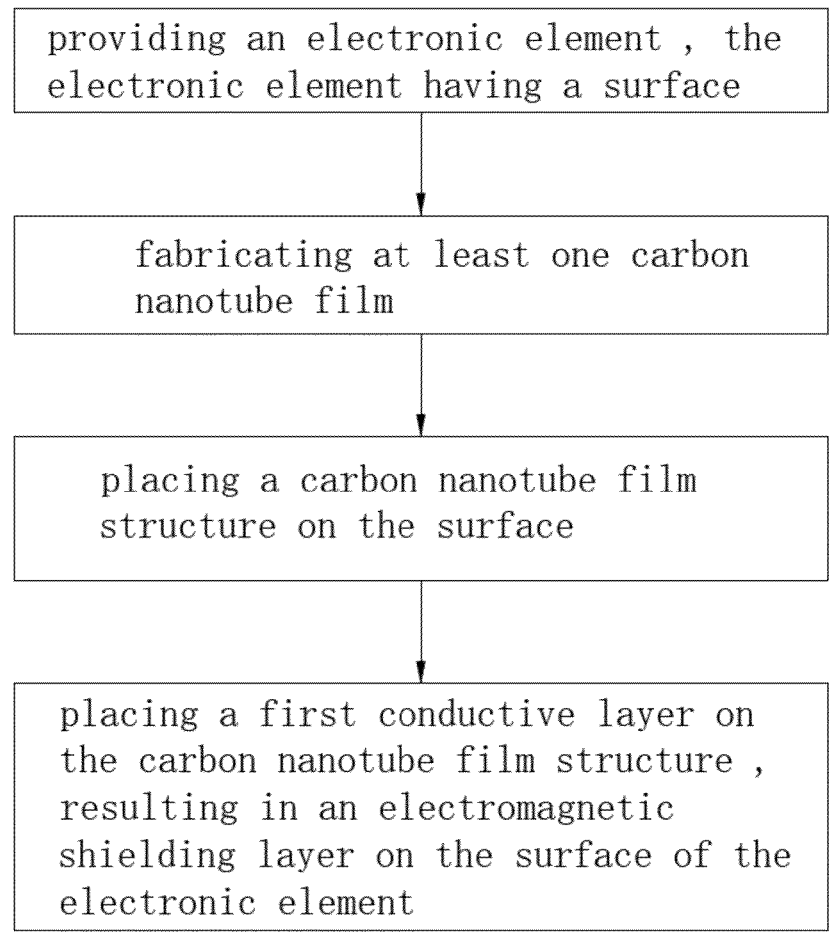
FIG. 5 is a flow chart of a method for making an electromagnetic shielding layer, in accordance with an exemplary embodiment.
Figure 5A:
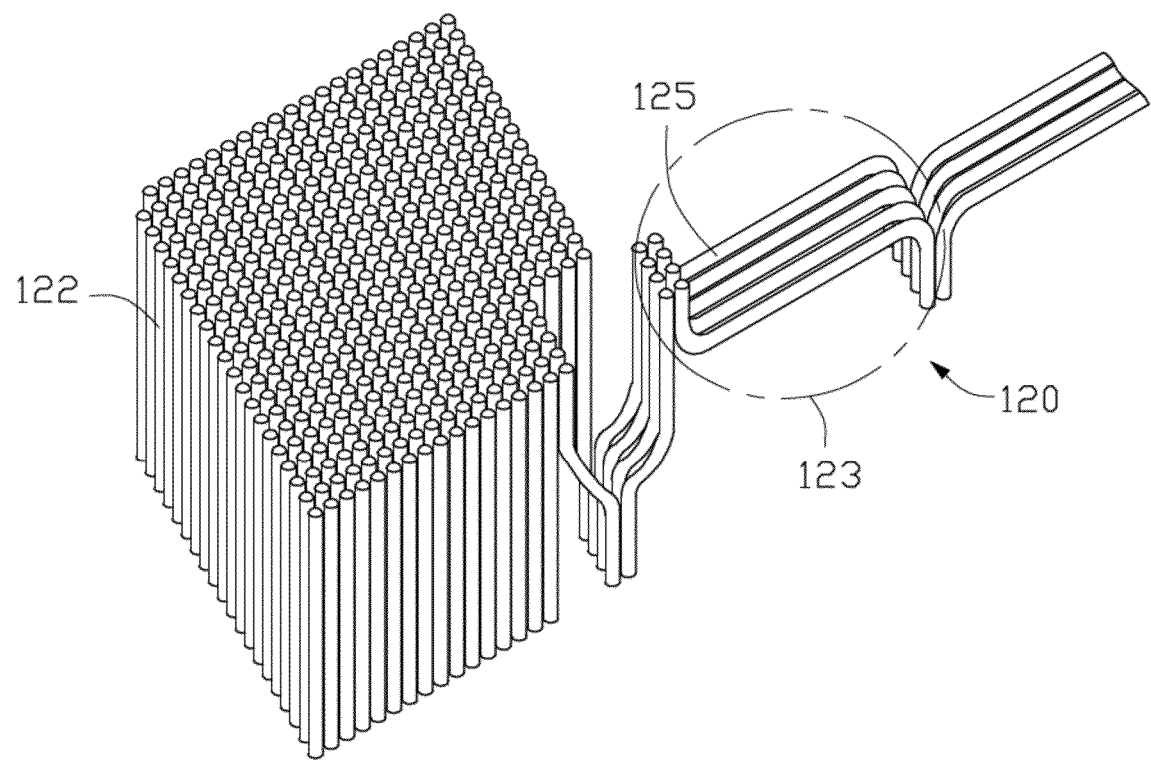
FIG. 5A is a schematic view of one embodiment of a method for making a carbon nanotube film, which is used in the method of FIG. 5.

Referring to FIG. 5 and FIG. 5A, a method for making the electromagnetic shielding layer 10 includes the steps of: (a) providing an electronic element 20, the electronic element 20 having a surface 201; (b) fabricating at least one carbon nanotube film 120; (c) placing a carbon nanotube film structure 12 on the surface 201 of the electronic element 20; and (d) placing a first conductive layer 14 on the carbon nanotube film structure 12, resulting in an electromagnetic shielding layer 10 on the surface 201 of the electronic element 20.

In step (b), the carbon nanotube film 120 can be fabricated by the substeps of: (b1) providing a substrate with a super-aligned array 122 of carbon nanotubes formed thereon; (b2) achieving a carbon nanotube film 120 from the super-aligned array 122 of carbon nanotubes by using a pulling tool (e.g., adhesive tape or another tool allowing multiple carbon nanotubes to be gripped and drawn simultaneously).

In step (b1), a given super-aligned array 122 of carbon nanotubes can be formed by the substeps of: (b11) providing a substantially flat and smooth substrate; (b12) forming a catalyst layer on the substrate; (b13) annealing the substrate with the catalyst at a temperature approximately ranging from 700° C. to 900° C. in air for about 30 to 90 minutes; (b14) heating the substrate with the catalyst at a temperature approximately ranging from 500° C. to 740° C. in a furnace with a protective gas therein; and (b15) supplying a carbon source gas into the furnace for about 5 to 30 minutes and growing a super-aligned array 122 of the carbon nanotubes from the substrate.

In step (b11), the substrate can be a P-type silicon wafer, an N-type silicon wafer, or a silicon wafer with a film of silicon dioxide thereon. A 4-inch P-type silicon wafer is used as the substrate.

In step (b12), the catalyst can be made of iron (Fe), cobalt (Co), nickel (Ni), or any alloy thereof.

In step (b14), the protective gas can be made up of at least one of the following: nitrogen ($N_2$), ammonia ($NH_3$), and a noble gas. In step (b15), the carbon source gas can be a hydrocarbon gas, such as ethylene ($C_2H_4$), methane ($CH_4$), acetylene ($C_2H_2$), ethane ($C_2H_6$), or any combination thereof.

The super-aligned array 122 of carbon nanotubes can be approximately 200 to 400 microns in height and includes a plurality of carbon nanotubes parallel to each other and substantially perpendicular to the substrate. The super-aligned array 122 of carbon nanotubes formed under the above conditions is essentially free of impurities, such as carbonaceous or residual catalyst particles. The carbon nanotubes in the super-aligned array 122 are packed together closely by van der Waals attractive force.

In step (b2), the carbon nanotube film 120 can be drawn out from the super-aligned array 122 of carbon nanotubes by the substeps of: (b21) selecting a number of carbon nanotube segments 123 having a predetermined width and using a tool to contact therewith; and (b22) drawing the carbon nanotube segments 123 at an even/uniform speed to form the carbon nanotube film 120.

In step (b21), the carbon nanotube segments 123 having a predetermined width can be selected by using a pulling tool, such as a wide adhesive tape, to contact the super-aligned array 122 of carbon nanotubes. In step (b22), the drawing direction is substantially along a direction perpendicular to the growing direction of the super-aligned array 122 of carbon nanotubes.

More specifically, during the drawing process, as the initial carbon nanotube segments 123 are drawn out, other carbon nanotube segments 123 are also drawn out end-to-end due to the van der Waals attractive force between ends of adjacent segments. This process of drawing ensures that a successive carbon nanotube film 120 can be formed. The carbon nanotubes 125 of the carbon nanotube film 120 are all substantially parallel to the drawing direction, and the carbon nanotube film 120 produced in such manner can be formed to have a selectable, predetermined width.

The width of the carbon nanotube film 120 depends on the size of the super-aligned array 122 of carbon nanotubes. The length of the carbon nanotube film 120 is arbitrary. In this embodiment, when the size of the substrate is 4 inches, the width of the carbon nanotube film 120 approximately ranges from 1 centimeter to 10 centimeters, and the thickness of the carbon nanotube film 120 approximately ranges from 0.01 to 100 microns.

In step (c), the carbon nanotube film structure 12 on the surface 201 of the electronic element 20 can be formed by the substeps of: (c1) providing a frame; (c2) laying at least one carbon nanotube film 120 on the frame and removing the excess film outside the frame, thereby forming a carbon nanotube film structure 12; (c3) peeling the carbon nanotube film structure 12 off the frame to achieve a self-supporting carbon nanotube film structure 12; and (c4) placing the self-supporting carbon nanotube film structure 12 on the surface 201 of the electronic element 20.

In step (c1), the frame is a square or rectangular metal frame using arbitrary metallic material (typically a chemically and mechanically durable metal/alloy). The size of the frame is dependant on the actual needs of utilization. When the width of the frame is larger than the width of the carbon nanotube film 120, a plurality of carbon nanotube films 120 can be adhered on the frame side-by-side with the carbon nanotubes being parallel to each other.

It is noted that because the carbon nanotubes in the super-aligned array 122 has a high level of purity and a high specific surface area, the carbon nanotube film structure 12 is adhesive. As such, the carbon nanotube film structure 12 can be adhered to the frame directly. The carbon nanotube film structure 12 is fixed onto the frame at an edge thereof.

In step (c), wherein the step (c) further comprises the substeps of: (c1'); laying at least one carbon nanotube film 120 on the surface 201 of the electronic element 20; (c2') removing the excess film outside the surface 201 of electronic element 20, thereby forming a carbon nanotube film structure 12 that approximately is the same shape and area as the surface 201.

After step (c), the carbon nanotube film structure 12 can be treated with an organic solvent.

The organic solvent is volatilizable and can be selected from the group consisting of ethanol, methanol, acetone, dichloroethane, chloroform, and combinations thereof. The carbon nanotube film structure 12 can be treated by the following two methods: dropping the organic solvent from a dropper to soak the entire surface of the carbon nanotube film structure 12 or immerging the frame with the carbon nanotube film structure 12 thereon into a container having an organic solvent therein. After being soaked by the organic solvent, the carbon nanotubes 125 in the carbon nanotube film structure 12 can at least partially shrink and come together into carbon nanotube strings due to the surface tension created by the organic solvent. Due to the decrease of the specific surface via bundling, the coefficient of friction of the carbon nanotube film structure 12 is reduced, while the carbon nanotube film structure 12 maintains its high mechanical strength and toughness.

In step (d), a first conductive layer 14 on a surface of the carbon nanotube film structure 12 can be formed by the following substeps: (d1) providing a conductive material which includes metal or conductive polymer; (d2) spraying or painting of the conductive material on the surface of the carbon nanotube film structure 12; and (d3) solidifying the conductive material in temperature ranging from 40° C. to 70° C., and forming the first conductive layer 14, thereby obtaining the electromagnetic shielding layer 10.

The method can further include a step of creating a second conductive layer 16 on the surface 201 of the electronic element 20.

Compared to the conventional electromagnetic shielding layer, the present electromagnetic shielding layer 10 has the following advantages: (1) the electromagnetic shielding layer 10 has a good electromagnetic shielding property due to the excellent conductivity of the carbon nanotubes; (2) the carbon nanotube film structure 12 is obtained by using a tool to draw out the array of carbon nanotubes, and the method for making the electromagnetic shielding layer 12 is relatively simple. The carbon nanotube film structure 12 can effectively resolve the electromagnetic interference existing in many devices such as mobile communication terminals, notebooks, car navigation devices and medical equipments.

It is to be understood that the above-described embodiments are intended to illustrate rather than limit the invention. Variations may be made to the embodiments without departing from the spirit of the invention as claimed. The above-described embodiments illustrate the scope of the invention but do not restrict the scope of the invention.

It is also to be understood that while some parts of the claims may have indicia associated with them, it is by no means an indication of an order. The indicia are used for identification purposes only.

The invention claimed is:

1. A method for making an electromagnetic shielding layer, the method comprising the steps of:
   (a) providing a surface;
   (b) fabricating at least one carbon nanotube film;
   (c) adhering a carbon nanotube film structure on the surface; and
   (d) forming a conductive layer on the carbon nanotube film structure, thereby obtaining the electromagnetic shielding layer on the surface, wherein the carbon nanotube film structure is located between the surface and the conductive layer.

2. The method as claimed in claim 1, wherein the step (b) comprises the substeps of:
   (b1) providing a substrate with a super-aligned array of carbon nanotubes formed thereon; and
   (b2) drawing the at least one carbon nanotube film from the super-aligned array of carbon nanotubes using a pulling tool.

3. The method as claimed in claim 2, wherein step (b1) comprises:
   (b11) providing a substantially flat and smooth substrate;
   (b12) forming a catalyst layer on the substrate;
   (b13) annealing the substrate with the catalyst at a temperature approximately ranging from 700° C. to 900° C. in air for about 30 to 90 minutes;
   (b14) heating the substrate with the catalyst at a temperature approximately ranging from 500° C. to 740° C. in a furnace with a protective gas therein; and
   (b15) supplying a carbon source gas into the furnace for about 5 to 30 minutes and growing the super-aligned array of the carbon nanotubes from the substrate.

4. The method as claimed in claim 3, wherein the super-aligned array of carbon nanotubes has a height of about 200 to about 400 microns.

5. The method as claimed in claim 2, wherein step (b2) comprises the substeps of:
   (b21) selecting a plurality of carbon nanotube segments having predetermined widths and using the pulling tool to contact therewith;
   (b22) drawing the carbon nanotube segments at a uniform speed along a direction perpendicular to the growing direction of the array of the carbon nanotubes to form the at least one carbon nanotube film.

6. The method as claimed in claim 5, wherein the step (c) comprises the substeps of:
   (c1) providing a frame;
   (c2) laying the at least one carbon nanotube film on the frame and removing the excess film outside the frame, thereby forming the carbon nanotube film structure;
   (c3) peeling the carbon nanotube film structure off the frame to achieve a self-supporting carbon nanotube film structure; and
   (c4) placing the self-supporting carbon nanotube film structure on the surface.

7. The method as claimed in claim 5, wherein the step (c) comprises the substeps of:
   (c1) laying the at least one carbon nanotube film on the surface; and (c2) removing the excess film, thereby forming the carbon nanotube film structure that is approximately the same shape and area as the surface.

8. The method as claimed in claim 2, further comprising a step of locating a conductive layer on the surface before step (d).

9. The method as claimed in claim 1, further comprising a step of treating the carbon nanotube film structure with an organic solvent after step (c).

10. The method as claimed in claim 9, wherein the organic solvent is comprised of at least one solvent selected from the group consisting of ethanol, methanol, acetone, dichloroethane, chloroform, and combinations thereof.

11. The method as claimed in claim 9, wherein the treating is done by either allowing organic solvent to soak the entire surface of the carbon nanotube film structure or by immerging the carbon nanotube film structure into a container having the organic solvent therein.

12. The method as claimed in claim 1, wherein the conductive layer is formed by spraying or painting.

13. A method for making an electromagnetic shielding layer, the method comprising the steps of:
(a) providing an electronic element having a surface;
(b) fabricating at least one carbon nanotube film;
(c) adhering the at least one carbon nanotube film on the surface to obtain a carbon nanotube structure on the surface; and
(d) forming a conductive layer on the carbon nanotube film structure, thereby obtaining the electromagnetic shielding layer on the surface, wherein the carbon nanotube film structure is located between the surface and the conductive layer.

14. The method as claimed in claim 13, wherein the step (b) comprises the substeps of:
(b1) providing a substrate with a super-aligned array of carbon nanotubes formed thereon;
(b2) drawing the at least one carbon nanotube film from the super-aligned array of carbon nanotubes.

15. The method as claimed in claim 14, wherein step (b1) comprises:
(b11) providing a substantially flat and smooth substrate;
(b12) forming a catalyst layer on the substrate;
(b13) annealing the substrate with the catalyst at a temperature approximately ranging from 700° C. to 900° C. in air for about 30 to 90 minutes;
(b14) heating the substrate with the catalyst at a temperature approximately ranging from 500° C. to 740° C. in a furnace with a protective gas therein; and
(b15) supplying a carbon source gas into the furnace for about 5 to 30 minutes and growing the super-aligned array of the carbon nanotubes from the substrate.

16. The method as claimed in claim 15, wherein the array of the carbon nanotubes has a height of about 200 to about 400 microns.

17. The method as claimed in claim 14, wherein step (b2) comprises the substeps of:
(b21) selecting a plurality of carbon nanotube segments having predetermined widths and using a pulling tool to contact therewith; and
(b22) drawing the carbon nanotube segments at a uniform speed along a direction perpendicular to the growing direction of the super-aligned array of the carbon nanotubes to form the at least one carbon nanotube film.

18. The method as claimed in claim 17, wherein the step (d) comprises the substeps of:
(d1) providing a conductive material which comprises metal or conductive polymer;
(d2) spraying or painting the conductive material on the surface of the carbon nanotube film structure; and
(d3) solidifying the conductive material in temperature ranging from 40° C. to 70° C., and forming the first conductive layer, thereby obtaining the electromagnetic shielding layer.

* * * * *